United States Patent
Killen et al.

(10) Patent No.: US 6,731,244 B2
(45) Date of Patent: May 4, 2004

(54) HIGH EFFICIENCY DIRECTIONAL COUPLER

(75) Inventors: William D. Killen, Melbourne, FL (US); Randy T. Pike, Grant, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/185,480

(22) Filed: Jun. 27, 2002

(65) Prior Publication Data

US 2004/0000964 A1 Jan. 1, 2004

(51) Int. Cl.$^7$ ............................. H01Q 1/38; H01P 5/18
(52) U.S. Cl. ............................ 343/700 MS; 333/116
(58) Field of Search .................. 343/700 MS; 333/116, 333/204, 246

(56) References Cited

U.S. PATENT DOCUMENTS

| | | |
|---|---|---|
| 3,571,722 A | 3/1971 | Vendelin |
| 3,581,243 A | 5/1971 | Alford |
| 3,678,418 A | 7/1972 | Woodward |
| 4,495,505 A | 1/1985 | Shields |
| 4,525,720 A | 6/1985 | Corzine et al. |
| 4,800,344 A | 1/1989 | Graham |
| 4,825,220 A | 4/1989 | Edward et al. |
| 4,882,553 A | 11/1989 | Davies et al. |
| 4,916,410 A | 4/1990 | Llttlefield |
| 4,924,236 A | 5/1990 | Schuss et al. |

(List continued on next page.)

FOREIGN PATENT DOCUMENTS

| | | |
|---|---|---|
| JP | JP 08 307117 | 11/1995 |
| JP | JP 10 190321 | 7/1998 |
| WO | WO 01 01453 | 1/2001 |

OTHER PUBLICATIONS

U.S. patent application Ser. No. 10/448,973, Delgado et al., filed May 30, 2003.*
U.S. patent application Ser. No. 10/184,277, Killen et al., filed Jun. 27, 2002.*
U.S. patent application Ser. No. 10/185,443, Killen et al., filed Jun. 27, 2002.*
U.S. patent application Ser. No. 10/184,332, Killen et al., filed Jun. 27, 2002.*
U.S. patent application Ser. No. 10/185,251, Parsche et al., filed Jun. 27, 2002.*
U.S. patent application Ser. No. 10/185,847, Killen et al., filed Jun. 27, 2002.*
U.S. patent application Ser. No. 10/185,275, Killen et al., filed Jun. 27, 2002.*

(List continued on next page.)

*Primary Examiner*—Michael C. Wimer
(74) *Attorney, Agent, or Firm*—Sacco & Associates, PA

(57) ABSTRACT

A circuit for processing radio frequency signals. The circuit includes a substrate where the circuit can be placed. The substrate can be a meta material and can incorporate at least one dielectric layer (100). A directional coupler (106) and at least one ground (112) can be coupled to the substrate. The dielectric layer can include a first region (102) with a first set of substrate properties and a second region (104) with a second set of substrate properties. The substrate properties can include a permittivity and a permeability. A substantial portion of the directional coupler (106) can be coupled to the second region (104). The permittivity and/or permeability of the second region (104) can be higher than the permittivity and/or permeability of the first region (102). The increased permittivities and/or permeabilities can reduce a size of the directional coupler (106) and effect a change in a variety of electrical characteristics associated with the directional coupler (106).

15 Claims, 2 Drawing Sheets

U.S. PATENT DOCUMENTS

| | | | |
|---|---|---|---|
| 4,967,171 A | | 10/1990 | Ban et al. |
| 5,039,891 A | | 8/1991 | Wen et al. |
| 5,148,130 A | | 9/1992 | Dietrich |
| 5,379,006 A | | 1/1995 | McCorkle |
| H1460 H | * | 7/1995 | Davis .................. 343/700 MS |
| 5,455,545 A | | 10/1995 | Garcia |
| 5,471,221 A | * | 11/1995 | Nalbandian et al. . 343/700 MS |
| 5,523,728 A | | 6/1996 | McCorkle |
| 5,559,521 A | * | 9/1996 | Evans et al. ......... 343/700 MS |
| 5,678,219 A | | 10/1997 | Agarwal et al. |
| 6,052,039 A | | 4/2000 | Chiou et al. |
| 6,114,940 A | | 9/2000 | Kakinuma et al. |
| 6,133,806 A | | 10/2000 | Sheen |
| 6,137,376 A | | 10/2000 | Imbornone et al. |
| 6,184,845 B1 | | 2/2001 | Leisten et al. |
| 6,307,509 B1 | | 10/2001 | Krantz |
| 6,433,741 B2 | * | 8/2002 | Tanizaki et al. ..... 343/700 MS |

OTHER PUBLICATIONS

U.S. patent application Ser. No. 10/185,273, Killen et al., filed Jun. 27, 2002.*

U.S. patent application Ser. No. 10/308,500, Killen et al., filed Dec. 3, 2002.*

U.S. patent application Ser. No. 10/373,935, Killen et al., filed Feb. 25, 2003.*

U.S. patent application Ser. No. 10/404,285, Killen et al., filed Mar. 31, 2003.*

U.S. patent application Ser. No. 10/404,981, Killen et al., filed Mar. 31, 2003.*

U.S. patent application Ser. No. 10/404,960, Killen et al., filed Mar. 31, 2003.*

U.S. patent application Ser. No. 10/185,144, Killen et al., filed Jun. 27, 2002.*

U.S. patent application Ser. No. 10/185,266, Killen et al., filed Jun. 27, 2002.*

U.S. patent application Ser. No. 10/185,162, Rumpf, Jr., et al., filed Jun. 27, 2002.*

U.S. patent application Ser. No. 10/185,824, Killen et al., filed Jun. 27, 2002.*

U.S. patent application Ser. No. 10/185,187, Killen et al., filed Jun. 27, 2002.*

U.S. patent application Ser. No. 10/185,855, Killen et al., filed Jun. 27, 2002.

U.S. patent application Ser. No. 10/185,459, Killen et al., filed Jun. 27, 2002.

U.S. patent application Ser. No. 10/439,094, Delgado et al., filed May 15, 2003.

* cited by examiner-

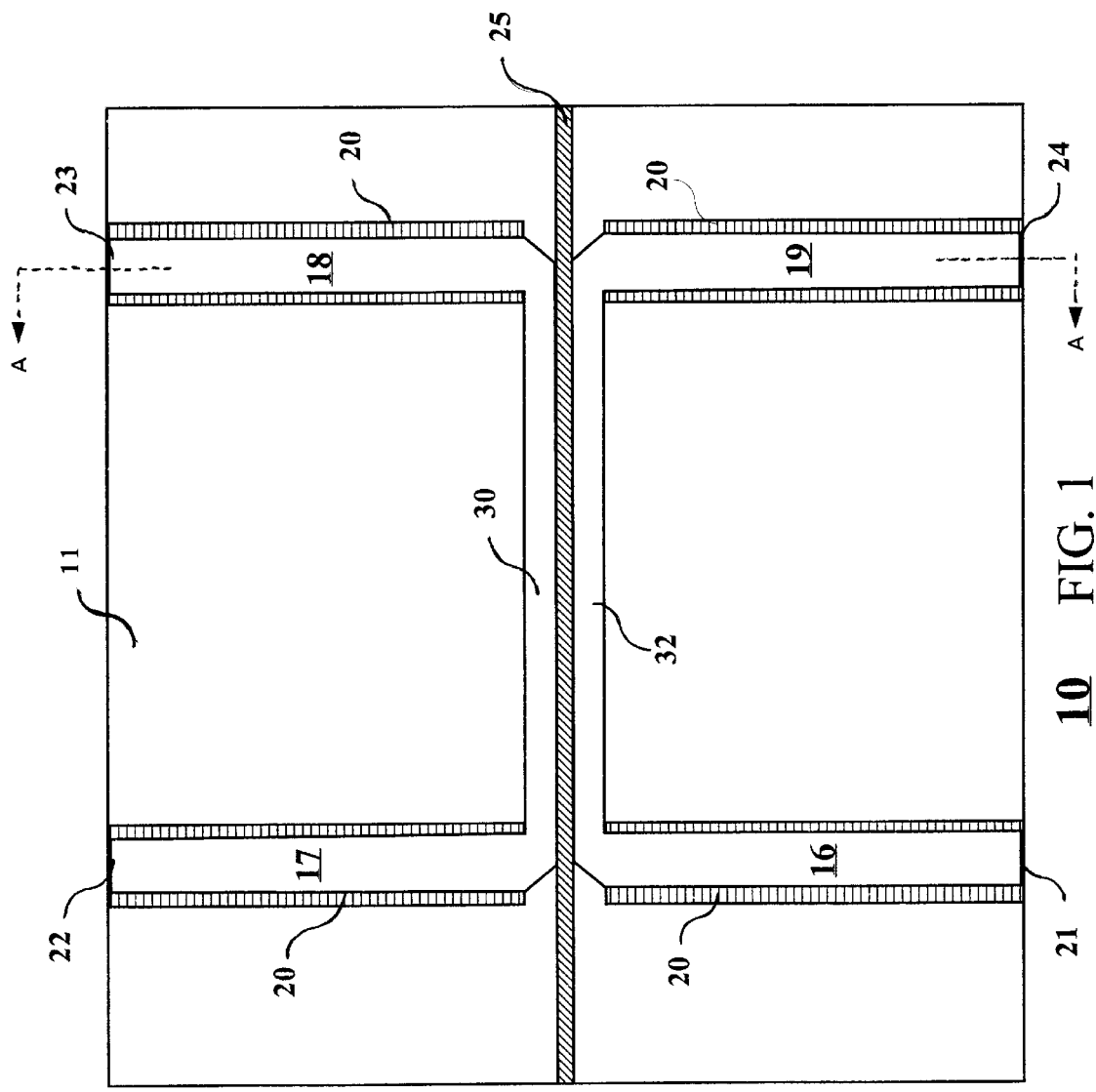

HIGH EFFICIENCY DIRECTIONAL COUPLER

BACKGROUND OF THE INVENTION

1. Statement of the Technical Field

The inventive arrangements relate generally to methods and apparatus for providing increased design flexibility for RF circuits, and more particularly for optimization of dielectric circuit board materials for improved performance in four port circuits such as directional couplers.

2. Description of the Related Art

RF circuits such as quarter-wave transformers and directional couplers are commonly manufactured on specially designed substrate boards. For the purposes of RF circuits, it is important to maintain careful control over impedance characteristics. If the impedance of different parts of the circuit does not match, this can result in inefficient power transfer, unnecessary heating of components, and other problems. A specific type of transmission line circuit often used to combine or divide two RF signals or obtain a low-level sample of a signal. Because the electrical length of the directional coupler must be a quarter wavelength at the center frequency, the performance of directional couplers in printed circuits can be a critical design factor.

A directional coupler is a four-port circuit formed by two parallel transmission lines in close proximity. When a signal passes through one of the transmission lines, a portion of the signal is coupled into the other line forming a signal in the opposite direction with a phase lead of 90 degrees. Being a linear device, a directional coupler can also add two signals in phase quadrature with no loss in total signal power except for ohmic loss. The level of the coupled signal is determined by the cross-section dimensions in the two transmission line region. The proximity of the two conductors creates a region of two characteristic impedances called the even and odd modes. The even mode is based on the two lines carrying currents in the same direction while the odd mode is based on the currents in opposite directions. Each mode has a different characteristic impedance, Zoe and Zoo respectively. The two conductor coupling region typically has a line length precisely $\lambda/4$, where $\lambda$ is the signal wavelength in the circuit. The proper characteristic impedance of a quarter-wave transformer is given by the formula Zo=root (ZoeZoo), where Zo is the desired characteristic impedance of the coupler, Zoe is the even mode impedance in the coupled region, and Zoo is the odd mode impedance in the coupled region. In a similar manner to a quarter wave transformer, multiple quarter wavelength coupler regions can be connected in series to achieve increased bandwidth. In these circuits, the coupling values are adjusted like the transformer circuit thereby changing the two-line geometry from coupling region to coupling region. The root of the even-mode and odd-mode impedances in every section are all equal to the same characteristic impedance, Zo.

Printed directional couplers, and in particular edge coupled directional couplers, used in RF circuits are typically formed in one of three ways. One configuration known as microstrip, places both edge-coupled directional coupler conductors on the same board surface and provides a second conductive layer, commonly referred to as a ground plane. A second type of configuration known as buried microstrip is similar except that the edge-coupled directional coupler is covered with a dielectric substrate material. In a third configuration known as stripline, the edge-coupled directional coupler is sandwiched within substrate between two electrically conductive (ground) planes. Those familiar with the art know that the same principle can be attached to directional couplers whose transmission lines are not coplanar. In this instance, there is a third dielectric layer with the two coupled lines etched on opposite sides. This configuration is called an overlapped coupler. If the two transmission lines are completely overlapped, the device is called a broadside directional coupler. Two critical factors affecting the performance of a substrate material are permittivity (sometimes called the relative permittivity or $\epsilon_r$) and the loss tangent (sometimes referred to as the dissipation factor). The relative permittivity determines the speed of the signal, and therefore the electrical length of transmission lines and other components implemented on the substrate. The loss tangent characterizes the amount of loss that occurs for signals traversing the substrate material. Accordingly, low loss materials become even more important with increasing frequency, particularly when designing receiver front ends and low noise amplifier circuits.

Ignoring loss, the characteristic impedance of a transmission line, such as stripline or microstrip, is equal to $\sqrt{L_1/C_1}$ where $L_1$ is the inductance per unit length and $C_1$ is the capacitance per unit length. Within the coupling region there two values of inductance and capacitance per unit length for the even and odd modes. Their values are generally determined by the physical geometry and spacing of the line structures and even or odd mode currents, as well as the permittivity of the dielectric material(s) used to separate the transmission line structures. Conventional substrate materials typically have a relative permitivity of approximately 1.0

In conventional RF design, a substrate material is selected that has a relative permittivity value suitable for the design. Once the substrate material is selected, the two characteristic impedance values are exclusively adjusted by controlling the line geometry and physical structure.

The permittivity of the chosen substrate material for a transmission line, passive RF device, or radiating element influences the physical wavelength of RF energy at a given frequency for that line structure. One problem encountered when designing microelectronic RF circuitry is the selection of a dielectric board substrate material that is optimized for all of the various passive components, radiating elements and transmission line circuits to be formed on the board. In particular, the geometry of certain circuit elements may be physically large or miniaturized due to the unique electrical or impedance characteristics required for such elements. Similarly, the line widths required for exceptionally high or low values of coupling (up to and including splitting the power into two equal parts) can, in many instances, be too narrow or too wide respectively for practical implementation for a given substrate. Since the physical size of the microstrip or stripline is inversely related to the relative permittivity of the dielectric material, the dimensions of a transmission line can be affected greatly by the choice of substrate board material.

Still, an optimal board substrate material design choice for some components may be inconsistent with the optimal board substrate material for other components, such as antenna elements. Moreover, some design objectives for a circuit component may be inconsistent with one another. For example, it may be desirable to reduce the size of an antenna element. This could be accomplished by selecting a board material with a relatively high dielectric. However, the use of a dielectric with a higher relative permittivity will generally have the undesired effect of reducing the radiation efficiency of the antenna. Accordingly, the constraints of a circuit board substrate having selected relative substrate properties often results in design compromises that can negatively affect the electrical performance and/or physical characteristics of the overall circuit.

An inherent problem with the foregoing approach is that, at least with respect to the substrate material, the only control variable for line impedance is the relative permittivity, $\epsilon_r$. This limitation highlights an important problem with conventional substrate materials, i.e. they fail to take advantage of the other factor that determines characteristic impedance, namely $L_1$, the inductance per unit length of the transmission line.

Yet another problem that is encountered in RF circuit design is the optimization of circuit components for operation on different RF frequency bands. Line impedances and lengths that are optimized for a first RF frequency band may provide inferior performance when used for other bands, either due to impedance variations and/or variations in electrical length. Such limitations can limit the effective operational frequency range for a given RF system.

Conventional circuit board substrates are generally formed by processes such as casting or spray coating which generally result in uniform substrate physical properties, including the permittivity. Accordingly, conventional dielectric substrate arrangements for RF circuits have proven to be a limitation in designing circuits that are optimal in regards to both electrical and physical size characteristics.

SUMMARY OF THE INVENTION

The present invention relates to a circuit for processing radio frequency signals. The circuit includes a substrate where the circuit can be placed. The substrate can include a meta material and can incorporate at least one dielectric layer. A directional coupler and at least one ground can be coupled to the substrate.

The dielectric layer can include a first region with a first set of substrate properties and at least a second region with a second set of substrate properties. The substrate properties can include permittivity and permeability. The second set of substrate properties can be different than the first set of substrate properties. In one embodiment the permittivity and/or permeability of the second region can be higher than the permittivity and/or permeability of the first region. Further, the first and/or second set of substrate properties can be differentially modified to vary a permittivity and/or a permeability over a selected region. The dielectric layer can further include other regions with different sets of substrate properties.

At least a portion of the directional coupler can be coupled to the second region. The increased permittivities and/or permeabilities can reduce a size of the directional coupler. The increased permittivities and/or permeabilities also can effect a change in at least one of an impedance, an inductance, a capacitance, a quality factor (Q) and a voltage associated with the directional coupler.

BRIEF DESCRIPTION OF THE DRAWINGS

FIG. 1 is a top view of a four port circuit formed on a substrate for reducing the size of the directional coupler in accordance with the present invention.

DETAILED DESCRIPTION OF THE PREFERRED EMBODIMENTS

A directional coupler and more particularly an edge coupled line directional coupler includes a pair of coupled transformer line sections that are specialized transmission lines that typically are used in radio frequency (RF) circuits and commonly implemented on printed circuit boards or substrates. Directional couplers typically have a coupled transmission line section, and four ports: input, direct, coupled, and isolated. The electrical length of the coupled transmission line section is usually one-quarter of a wavelength of a selected frequency, but a directional coupler also can be any odd multiple (2n+1) of the one-quarter wavelength.

Low permittivity printed circuit board materials are ordinarily selected for RF circuit designs implementing directional couplers. For example, polytetrafluoroethylene (PTFE) based composites such as RT/duroid® 6002 (permittivity of 2.94; loss tangent of 0.009) and RT/duroid® 5880 (permittivity of 2.2; loss tangent of 0.0007) are both available from Rogers Microwave Products, Advanced Circuit Materials Division, 100 S. Roosevelt Ave, Chandler, Ariz. 85226. Both of these materials are common board material choices. The above board materials provide dielectric layers having relatively low permittivities with accompanying low loss tangents.

However, use of conventional board materials can compromise the miniaturization of circuit elements and may also compromise some performance aspects of circuits that can benefit from high permittivity layers. Typical tradeoffs in a communications circuit are between the physical size of a directional coupler versus operational frequency and the relative power levels between the direct and coupled ports. By comparison, the present invention provides the circuit designer with an added level of flexibility by permitting use of a high permittivity dielectric layer region with magnetic properties optimized for reducing the size or increasing the coupling of a directional coupler for operation at a specific frequency. Further, the present invention also provides the circuit designer with means for controlling the quality factor (Q) of the directional coupler. This added flexibility enables improved performance not otherwise possible for directional coupler RF circuits. As defined herein, RF means any frequency that can be used to propagate an electromagnetic wave.

Figure 2:
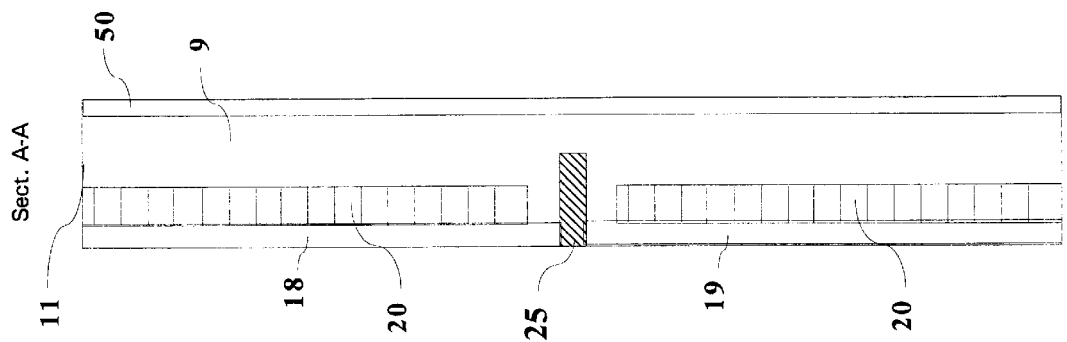
FIG. 2 is a cross-sectional view of the directional coupler of FIG. 1 taken along line A—A.

Referring to FIGS. 1 and 2, according to the preferred embodiment a four port circuit 10 such as an edge coupled line directional coupler comprises a substrate or dielectric layer 11 comprises a first region 9 having a first set of substrate properties and a second region 20 having a second set of substrate properties. The substrate 11 can also have other regions with yet another set of substrate properties such as region 25. The substrate properties can include a permittivity and a permeability. Notably, the second set of substrate properties can be different than the first set of substrate properties or other set of substrate properties on the substrate. For example, the second region 20 can have a higher permittivity and/or permeability than the first region 9 and the region 25 can have a different permittivity and/or permeability than regions 9 or 20.

Directional coupler sections 16 and 19 can be mounted on the dielectric layer 11, connected together by a first transmission line 32. Coupled transformer line sections 17 and 18 can be mounted on the dielectric layer 11, connected together by a second transmission line 30. First transmission line 32 and second transmission line 30 can arranged to be edge coupled transmission lines in parallel proximity to each other where the dielectric layer or region 25 between the first and second transmission lines is preferably optimized for coupling. The four port circuit 10 as shown thus includes port 21 serving as an input port, port 22 serving as a coupled port, port 23 as the isolated port, and port 24 as the thru output port of the edge coupled line directional coupler.

Couplers are constructed by having a main transmission line (32) in parallel proximity to a secondary line (30). As a result of this proximity, a percentage of the power present on the main line is coupled to the secondary line and the power varies as a function of the physical dimensions of the coupler and the direction of the propagation of the primary power. This can be seen in FIG. 1, noting that the coupled section is approximately a quarter wavelength at the center of the band of frequencies coupled. Power incident on the main line at port 21 will be coupled at some reduced power level to port 22, while the primary power continues to port 24. Port 23 is normally terminated in a load equal to the characteristic impedance of the line. In an ideal coupler, no power will appear at port 23. The amount of power coupled from port 21 to 22 is a function of the design, expressed by the even and odd mode impedances (even mode impedances of the line defined by the currents associated with each individual line and ground, and odd mode impedances of the line defined by the currents associated with the coupling of the two transmission lines.

It should be noted that directivity is a quality factor related to the directional coupler. It defines the amount of power appearing at the uncoupled port, 23. In absolute terms, it is expressed as isolation. However this is not a true measure of coupling quality. Directivity is equal to isolation minus coupling and therefore remains relatively constant as a function of physical construction rather than coupling, unless the even and odd mode velocities are unequal which occurs when the coupler is implemented in open microstrip. A second factor effecting directivity is internal match, a function, in turn, of the balance of the even and odd mode impedances. A third factor is the end junction mismatches that result as the secondary line is decoupled from the primary line at each end of the quarter wave section. A forth is the load VSWR on the main and secondary output ports.

If assuming construction of the directional coupler is on a solid homogenous medium, then VSWR becomes the most frequently limiting parameter on coupler directivity. Otherwise, control of even and odd mode impedance (by optimizing the coupling) becomes the controlling parameter of coupler directivity, hence the ability to achieve improved coupler performance, especially improved input VSWR and increased isolation is achieved using the techniques of the present invention.

FIG. 2 is a cross-sectional view, shown along section line A—A, of the four port circuit 10 and dielectric layer 11 of FIG. 1. A ground plane 50 can be provided beneath the directional coupler line sections. Accordingly, dielectric layer 11 can have a thickness that defines a directional coupler height above ground. The thickness is approximately equal to the physical distance from the directional coupler to the underlying ground plane 50. This distance can be adjusted to achieve particular dielectric geometries, for example, to increase or decrease capacitance when a certain dielectric material is used.

The propagation velocity of a signal traveling on the directional coupler is equal to $$\frac{c}{\sqrt{\mu_r \varepsilon_r}}.$$

Since propagation velocity is inversely proportion to relative permeability and relative permittivity, increasing the permeability and/or permittivity in the second region 20 decreases propagation velocity of the signal on the directional coupler, and thus the signal wavelength. Hence, the length of the directional coupler can be reduced by increasing the permeability and/or permittivity of the second region 20. Further, an increase in permittivity increases the capacitive coupling between the directional coupler and the ground 50. Thus, the directional coupler surface area also can be reduced by increasing the permittivity of the second region 20. Accordingly, the directional coupler can be smaller, both in length and width, than would otherwise be required on a conventional circuit board.

The permittivity and/or permeability can be chosen to result in a desired characteristic impedance ($Z_0$) for the directional coupler as well, or to control inductance or resistance values associated with the directional coupler. For example, the permeability the second region 20 can be increased to increase the inductance of the directional coupler.

In one embodiment of the invention the permeability of the dielectric layer 11 can be controlled to increase the inductance of all or part of the directional coupler sections. In another embodiment (not shown), the directional coupler can have its own individual ground plane or return trace (such as in a twin line arrangement) configured so that current on the ground plane or return trace flows in an opposite direction to current flowing in the directional coupler, thereby resulting in cancellation of magnetic flux associated with the quarter-wave transformer sections and lowering its inductance.

The permittivity and/or permeability can be differentially modified at selected regions of the dielectric layer to optimize quarter-wave transformer performance. In yet another arrangement, all dielectric layer regions can be modified by differentially modifying permittivity and/or permeability in all regions of the dielectric layer.

The term "differential modifying" as used herein refers to any modifications, including additions, to the dielectric layer 11 that result in at least one of the dielectric and magnetic properties being different at one region of the substrate as compared to another region. For example, the modification can be a selective modification where certain dielectric layer regions are modified to produce a specific dielectric or magnetic properties, while other dielectric layer regions are left un-modified.

According to one embodiment (not shown), a supplemental dielectric layer can be added to dielectric layer 11. Techniques known in the art such as various spray technologies, spin-on technologies, various deposition technologies or sputtering can be used to apply the supplemental layer. A first supplemental layer can be added over the entire existing dielectric layer 11 and/or a second supplemental layer can be selectively added in the second region 20 or selected portions thereof to change the permittivity and/or permeability of the dielectric beneath quarter-wave transformer sections 16–19. In an alternate embodiment, the supplemental layer can be added to the first region 9 or selected portions thereof or to other regions such as region 25. For example, the supplemental layer can be added below the first transmission line 32 to increase the permittivity and/or permeability in that region.

Notably, the supplemental layer can include particles to change the relative permeability in the first and/or second regions or other regions (9, 20, or 25) to be greater or less than 1. For example, diamagnetic or ferromagnetic particles can be added to any of the regions. Further, dielectric particles can be added to either of the regions as well. Additionally, the first supplemental layer and the second supplemental layer can be provided in any circuit configuration, for example stripline, microstrip and buried microstrip.

Figure 3:
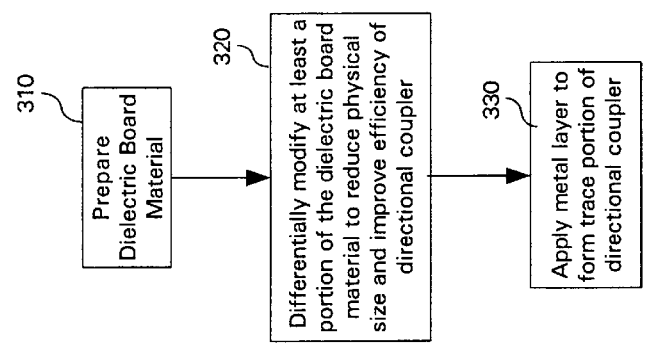
FIG. 3 is a flow chart that is useful for illustrating a process for manufacturing a four port circuit of reduced physical size in accordance with the present invention.

A method for providing a size and performance optimized directional coupler is described with reference to the text below and the flow chart presented in FIG. 3. In step 310, board dielectric material is prepared for modification. As previously noted, the board material can include commercially available off the shelf board material or customized board material formed from a polymer material, or some combination thereof. The preparation process can be made dependent upon the type of board material selected.

In step 320, one or more dielectric layer regions, such as the first and second regions 9 and 20, can be differentially modified so that the permittivity and/or permeability differ between two or more portions of the regions. The differential modification can be accomplished in several different ways, as previously described. Referring to step 330, the metal layer then can be applied to the directional coupler using standard circuit board techniques known in the art.

Dielectric substrate boards having metamaterial regions providing localized and selectable magnetic and substrate properties can be prepared in the following manner. As defined herein, the term "metamaterials" refers to composite materials formed from the mixing or arrangement of two or more different materials at a very fine level, such as the molecular or nanometer level. Metamaterials allow tailoring of electromagnetic properties of the composite, which can be defined by effective electromagnetic parameters comprising effective electrical permittivity $\epsilon_{\textit{eff}}$ (or permittivity) and the effective magnetic permeability $\mu_{\textit{eff}}$.

Appropriate bulk dielectric substrate materials can be obtained from commercial materials manufacturers, such as DuPont and Ferro. The unprocessed material, commonly called Green Tape™, can be cut into sized regions from a bulk dielectric tape, such as into 6 inch by 6 inch regions. For example, DuPont Microcircuit Materials provides Green Tape material systems, such as 951 Low-Temperature Cofire Dielectric Tape and Ferro Electronic Materials ULF28-30 Ultra Low Fire COG dielectric formulation. These substrate materials can be used to provide dielectric layers having relatively moderate permittivities with accompanying relatively low loss tangents for circuit operation at microwave frequencies once fired.

In the process of creating a microwave circuit using multiple sheets of dielectric substrate material, features such as vias, voids, holes, or cavities can be punched through one or more layers of tape. Voids can be defined using mechanical means (e.g. punch) or directed energy means (e.g., laser drilling, photolithography), but voids can also be defined using any other suitable method. Some vias can reach through the entire thickness of the sized substrate, while some voids can reach only through varying regions of the substrate thickness.

The vias can then be filled with metal or other dielectric or magnetic materials, or mixtures thereof, usually using stencils for precise placement of the backfill materials. The individual layers of tape can be stacked together in a conventional process to produce a complete, multi-layer substrate. Alternatively, individual layers of tape can be stacked together to produce an incomplete, multi-layer substrate generally referred to as a sub-stack.

Voided regions can also remain voids. If backfilled with selected materials, the selected materials preferably include metamaterials. The choice of a metamaterial composition can provide tunable effective dielectric constants over a relatively continuous range from less than 2 to about 2650.

Tunable magnetic properties are also available from certain metamaterials. For example, through choice of suitable materials the relative effective magnetic permeability generally can range from about 4 to 116 for most practical RF applications. However, the relative effective magnetic permeability can be as low as about 2 or reach into the thousands.

The term "differentially modified" as used herein refers to modifications, including dopants, to a dielectric substrate layer that result in at least one of the dielectric and magnetic properties being different at one region of the substrate as compared to another region. A differentially modified board substrate preferably includes one or more metamaterial containing regions.

For example, the modification can be selective modification where certain dielectric layer regions are modified to produce a first set of dielectric or magnetic properties, while other dielectric layer regions are modified differentially or left unmodified to provide dielectric and/or magnetic properties different from the first set of properties. Differential modification can be accomplished in a variety of different ways.

According to one embodiment, a supplemental dielectric layer can be added to the dielectric layer. Techniques known in the art such as various spray technologies, spin-on technologies, various deposition technologies or sputtering can be used to apply the supplemental dielectric layer. The supplemental dielectric layer can be selectively added in localized regions, including inside voids or holes, or over the entire existing dielectric layer. For example, a supplemental dielectric layer can be used for providing a substrate region having an increased effective dielectric constant. The dielectric material added as a supplemental layer can include various polymeric materials.

The differential modifying step can further include locally adding additional material to the dielectric layer or supplemental dielectric layer. The addition of material can be used to further control the effective dielectric constant or magnetic properties of the dielectric layer to achieve a given design objective.

The additional material can include a plurality of metallic and/or ceramic particles. Metal particles preferably include iron, tungsten, cobalt, vanadium, manganese, certain rare-earth metals, nickel or niobium particles. The particles are preferably nanosize particles, generally having sub-micron physical dimensions, hereafter referred to as nanoparticles.

The particles, such as nanoparticles, can preferably be organofunctionalized composite particles. For example, organofunctionalized composite particles can include particles having metallic cores with electrically insulating coatings or electrically insulating cores with a metallic coating.

Magnetic metamaterial particles that are generally suitable for controlling magnetic properties of dielectric layer for a variety of applications described herein include ferrite organoceramics (FexCyHz)—(Ca/Sr/Ba-Ceramic). These particles work well for applications in the frequency range of 8–40 GHz. Alternatively, or in addition thereto, niobium organoceramics (NbCyHz)—(Ca/Sr/Ba-Ceramic) are useful for the frequency range of 12–40 GHz. The materials designated for high frequency are also applicable to low frequency applications. These and other types of composite particles can be obtained commercially.

In general, coated particles are preferable for use with the present invention as they can aid in binding with a polymer matrix or side chain moiety. In addition to controlling the magnetic properties of the dielectric, the added particles can also be used to control the effective dielectric constant of the material. Using a fill ratio of composite particles from approximately 1 to 70%, it is possible to raise and possibly lower the dielectric constant of substrate dielectric layer and/or supplemental dielectric layer regions significantly. For example, adding organofunctionalized nanoparticles to a dielectric layer can be used to raise the dielectric constant of the modified dielectric layer regions.

Particles can be applied by a variety of techniques including polyblending, mixing and filling with agitation. For example, a dielectric constant may be raised from a value of 2 to as high as 10 by using a variety of particles with a fill ratio of up to about 70%. Metal oxides useful for this purpose can include aluminum oxide, calcium oxide, magnesium oxide, nickel oxide, zirconium oxide and niobium (II, IV and V) oxide. Lithium niobate ($LiNbO_3$), and zirconates, such as calcium zirconate and magnesium zirconate, also may be used.

The selectable substrate properties can be localized to areas as small as about 10 nanometers, or cover large area regions, including the entire board substrate surface. Conventional techniques such as lithography and etching along with deposition processing can be used for localized dielectric and magnetic property manipulation.

Materials can be prepared mixed with other materials or including varying densities of voided regions (which generally introduce air) to produce effective dielectric constants in a substantially continuous range from 2 to about 2650, as well as other potentially desired substrate properties. For example, materials exhibiting a low dielectric constant (<2 to about 4) include silica with varying densities of voided regions. Alumina with varying densities of voided regions can provide a dielectric constant of about 4 to 9. Neither silica nor alumina have any significant magnetic permeability. However, magnetic particles can be added, such as up to 20 wt. %, to render these or any other material significantly magnetic. For example, magnetic properties may be tailored with organofunctionality. The impact on dielectric constant from adding magnetic materials generally results in an increase in the dielectric constant.

Medium dielectric constant materials have a dielectric constant generally in the range of 70 to 500+/−10%. As noted above these materials may be mixed with other materials or voids to provide desired effective dielectric constant values. These materials can include ferrite doped calcium titanate. Doping metals can include magnesium, strontium and niobium. These materials have a range of 45 to 600 in relative magnetic permeability.

For high dielectric constant applications, ferrite or niobium doped calcium or barium titanate zirconates can be used. These materials have a dielectric constant of about 2200 to 2650. Doping percentages for these materials are generally from about 1 to 10%. As noted with respect to other materials, these materials may be mixed with other materials or voids to provide desired effective dielectric constant values.

These materials can generally be modified through various molecular modification processing. Modification processing can include void creation followed by filling with materials such as carbon and fluorine based organo functional materials, such as polytetrafluoroethylene PTFE.

Alternatively or in addition to organofunctional integration, processing can include solid freeform fabrication (SFF), photo, uv, x-ray, e-beam or ion-beam irradiation. Lithography can also be performed using photo, uv, x-ray, e-beam or ion-beam radiation.

Different materials, including metamaterials, can be applied to different areas on substrate layers (sub-stacks), so that a plurality of areas of the substrate layers (sub-stacks) have different dielectric and/or magnetic properties. The backfill materials, such as noted above, may be used in conjunction with one or more additional processing steps to attain desired, dielectric and/or magnetic properties, either locally or over a bulk substrate region.

A top layer conductor print is then generally applied to the modified substrate layer, sub-stack, or complete stack. Conductor traces can be provided using thin film techniques, thick film techniques, electroplating or any other suitable technique. The processes used to define the conductor pattern include, but are not limited to standard lithography and stencil.

A base plate is then generally obtained for collating and aligning a plurality of modified board substrates. Alignment holes through each of the plurality of substrate boards can be used for this purpose.

The plurality of layers of substrate, one or more sub-stacks, or combination of layers and sub-stacks can then be laminated (e.g. mechanically pressed) together using either isostatic pressure, which puts pressure on the material from all directions, or uniaxial pressure, which puts pressure on the material from only one direction. The laminate substrate is then is further processed as described above or placed into an oven to be fired to a temperature suitable for the processed substrate (approximately 850 C to 900 C for the materials cited above).

The plurality of ceramic tape layers and stacked sub-stacks of substrates can then be fired, using a suitable furnace that can be controlled to rise in temperature at a rate suitable for the substrate materials used. The process conditions used, such as the rate of increase in temperature, final temperature, cool down profile, and any necessary holds, are selected mindful of the substrate material and any material backfilled therein or deposited thereon. Following firing, stacked substrate boards, typically, are inspected for flaws using an optical microscope.

The stacked ceramic substrates can then be optionally diced into cingulated pieces as small as required to meet circuit functional requirements. Following final inspection, the cingulated substrate pieces can then be mounted to a test fixture for evaluation of their various characteristics, such as to assure that the dielectric, magnetic and/or electrical characteristics are within specified limits.

Thus, dielectric substrate materials can be provided with localized tunable dielectric and/or magnetic characteristics for improving the density and performance of circuits, including those comprising quarter-wave transformers. The dielectric flexibility allows independent optimization of circuit elements.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. A circuit for processing radio frequency signals, comprising:
   a substrate comprising a metamaterial and including at least one dielectric layer, said dielectric layer having a first region and at least a second region, said first region having a first set of substrate properties and said second region having a second set of substrate properties, said second set of substrate properties providing different substrate characteristics than said first set of substrate properties;

at least one ground coupled to said substrate; and, a directional coupler coupled to said substrate;

wherein at least a portion of said directional coupler is coupled to said second region.

2. The circuit of claim 1 wherein at least one of said first set of substrate properties and said second set of substrate properties is differentially modified to vary at least one of a permittivity and a permeability over a selected region.

3. The circuit of claim 1 wherein said first set of substrate properties comprises a first permittivity and said second set of substrate properties comprises a second permittivity, said second permittivity being higher than said first permittivity.

4. The circuit of claim 3 wherein a propagation velocity of a signal on a section of said directional coupler coupled to said second region is lower than a propagation velocity of a signal on a portion of line coupled to said first region.

5. The circuit of claim 3 wherein said second permittivity is higher than said first permittivity to effect a change in at least one electrical characteristic of said directional coupler.

6. The circuit of claim 5 wherein said electrical characteristic is selected from the group comprising an impedance, an inductance, a capacitance, quality factor (Q) and a voltage.

7. The circuit of claim 1 wherein said first set of substrate properties comprises a first permeability and said second set of substrate properties comprises a second permeability, said second permeability being higher than said first permeability.

8. A printed circuit for processing radio frequency signals, comprising:

a substrate upon which said circuit is placed, said substrate comprising a metamaterial and including at least one dielectric layer, said dielectric layer having a first set of dielectric properties over a first region, and at least a second set of dielectric properties over a second region, said second set of dielectric properties providing a different dielectric permittivity and magnetic permeability as compared to said first set of dielectric properties;

at least one ground coupled to said substrate; and, a directional coupler having at least a portion of said directional coupler line sections coupled to at least a portion of said second region.

9. The circuit of claim 8 wherein at least one of said first set of dielectric properties and said second set of dielectric properties is controlled to reduce a size of said directional coupler.

10. The circuit of claim 8 wherein the substrate further includes a dielectric layer having a third set of dielectric properties over a third region optimized for coupling between a first transmission line and a second transmission line of the directional coupler.

11. The circuit of claim 10 wherein the dielectric layer having the third set of dielectric properties lies between the first transmission line and a second transmission line of the directional coupler.

12. The circuit of claim 8 wherein at least one of said first set of dielectric properties and said second set of dielectric properties is controlled to adjust a capacitance between said directional coupler and another metallic structure.

13. The circuit of claim 8 wherein at least one of said first set of dielectric properties and said second set of dielectric properties is controlled to adjust the quail factor (Q) of said directional coupler.

14. A printed circuit for processing radio frequency signals, comprising:

a substrate comprising a metamaterial and including substrate regions upon which said circuit is placed, wherein said circuit is an directional coupler, said directional coupler including a pair of coupled transmission lines; and at least one ground coupled to said substrate, wherein the directional coupler is at less partially coupled to respective substrate regions that have substrate characteristics that are each independently customizable.

15. The printed circuit of claim 14 wherein the substrate characteristics that are each independently customizable are selected from the group comprising dielectric permittivity and magnetic permeability.

* * * * *

UNITED STATES PATENT AND TRADEMARK OFFICE
CERTIFICATE OF CORRECTION

PATENT NO. : 6,731,244 B2
DATED : May 4, 2004
INVENTOR(S) : Killen et al.

It is certified that error appears in the above-identified patent and that said Letters Patent is hereby corrected as shown below:

Column 12,
Line 22, delete "quail" and replace with -- quality --

Signed and Sealed this

Fourth Day of January, 2005

JON W. DUDAS
*Director of the United States Patent and Trademark Office*